US009818888B2

(12) United States Patent
McCamy et al.

(10) Patent No.: US 9,818,888 B2
(45) Date of Patent: Nov. 14, 2017

(54) ARTICLE WITH BUFFER LAYER AND METHOD OF MAKING THE SAME

(71) Applicant: Vitro S.A.B. de C.V., San Pedro Garza Garcia (MX)

(72) Inventors: James W. McCamy, Export, PA (US); Zhixun Ma, Cheswick, PA (US); Benjamin Kabagambe, Pittsburgh, PA (US); Kwaku K. Koram, Wexford, PA (US); Cheng-Hung Hung, Wexford, PA (US); Gary J. Nelis, Pittsburgh, PA (US)

(73) Assignee: Vitro, S.A.B. de C.V., Nuevo León (MX)

( * ) Notice: Subject to any disclaimer, the term of this patent is extended or adjusted under 35 U.S.C. 154(b) by 0 days.

(21) Appl. No.: 14/963,799

(22) Filed: Dec. 9, 2015

(65) Prior Publication Data
US 2016/0264458 A1    Sep. 15, 2016

Related U.S. Application Data

(60) Provisional application No. 62/131,938, filed on Mar. 12, 2015.

(51) Int. Cl.
C03C 17/34    (2006.01)
C03B 17/06    (2006.01)
(Continued)

(52) U.S. Cl.
CPC ........ *H01L 31/02168* (2013.01); *C03B 17/06* (2013.01); *C03B 18/14* (2013.01);
(Continued)

(58) Field of Classification Search
None
See application file for complete search history.

(56) References Cited

U.S. PATENT DOCUMENTS

| 4,924,936 A | 5/1990 | McKown |
| 4,988,561 A | 1/1991 | Wason |

(Continued)

FOREIGN PATENT DOCUMENTS

| EP | 1930471 A2 | 11/2008 |
| GB | 2405030 A | 2/2005 |

(Continued)

OTHER PUBLICATIONS

Stadler, "Transparent Conducting Oxides—An Up-To-Date Overview", Materials pp. 661-683, 2012.*

(Continued)

*Primary Examiner* — Lisa Herring
(74) *Attorney, Agent, or Firm* — Andrew C. Siminerio

(57) ABSTRACT

A method of forming a coating layer on a glass substrate in a glass manufacturing process includes: providing a first coating precursor material for a selected coating layer composition to at least one multislot coater to form a first coating region of the selected coating layer; and providing a second coating precursor material for the selected coating layer composition to the multislot coater to form a second coating region of the selected coating layer over the first region. The first coating precursor material is different than the second precursor coating material.

18 Claims, 4 Drawing Sheets

(51) Int. Cl.
- C23C 16/40 (2006.01)
- C23C 16/44 (2006.01)
- H01L 31/0216 (2014.01)
- H01L 31/0224 (2006.01)
- H01L 31/0232 (2014.01)
- C03B 18/14 (2006.01)
- C23C 16/455 (2006.01)
- H01L 31/18 (2006.01)
- C23C 16/54 (2006.01)

(52) U.S. Cl.
CPC ...... *C03C 17/3411* (2013.01); *C03C 17/3417* (2013.01); *C23C 16/40* (2013.01); *C23C 16/407* (2013.01); *C23C 16/4412* (2013.01); *C23C 16/45561* (2013.01); *C23C 16/45595* (2013.01); *C23C 16/54* (2013.01); *H01L 31/02167* (2013.01); *H01L 31/02327* (2013.01); *H01L 31/022425* (2013.01); *H01L 31/022466* (2013.01); *H01L 31/18* (2013.01); *C03C 2217/94* (2013.01); *C03C 2217/948* (2013.01); *C03C 2218/1525* (2013.01); *Y02P 70/521* (2015.11)

(56) References Cited

U.S. PATENT DOCUMENTS

| 5,356,451 | A | 10/1994 | Cain et al. | |
|---|---|---|---|---|
| 5,683,516 | A | 11/1997 | DeDontney et al. | |
| 6,024,084 | A * | 2/2000 | Gerhardinger | C03C 17/3417 126/200 |
| 7,597,938 | B2 * | 10/2009 | Thomsen | C03C 17/3417 427/165 |
| 7,730,747 | B2 | 6/2010 | Galante et al. | |
| 2004/0180218 | A1 * | 9/2004 | Nagashima | C03B 18/18 428/432 |
| 2004/0197575 | A1 * | 10/2004 | Bocko | B32B 17/06 428/432 |
| 2009/0214770 | A1 * | 8/2009 | Chatterjee | C03C 17/002 427/168 |
| 2010/0126227 | A1 * | 5/2010 | Fekety | C03C 17/06 65/441 |
| 2011/0037379 | A1 | 2/2011 | Lecamp et al. | |
| 2012/0132269 | A1 * | 5/2012 | Hickman | C03C 3/087 136/256 |
| 2012/0240634 | A1 * | 9/2012 | Sanderson | C03C 17/002 65/60.5 |
| 2014/0311573 | A1 * | 10/2014 | McCamy | H01L 31/022466 136/261 |
| 2014/0352355 | A1 * | 12/2014 | Boudreau | C23C 16/45595 65/25.3 |
| 2015/0353408 | A1 | 12/2015 | Nishimura | |
| 2016/0154508 | A1 * | 6/2016 | Chaturvedi | G06F 3/041 345/173 |

FOREIGN PATENT DOCUMENTS

| WO | 01/58941 A1 | 4/2001 |
|---|---|---|
| WO | 2004/023436 A2 | 3/2004 |
| WO | 2014163063 A1 | 10/2014 |

OTHER PUBLICATIONS

Huang et al., "Transparent conductive tungsten-doped tin oxide thin films synthesized by sol-gel technique on quartz glass substrates", J. Sol-Gel Sci Technol (2010), pp. 276-281.*
U.S. Appl. No. 14/963,738, filed Dec. 9, 2015, McCamy et al, Article With Buffer Layer.
U.S. Appl. No. 14/963,778, filed Dec. 9, 2015, McCamy et al, Article With Transparent Conductive Oxide Coating.
U.S. Appl. No. 14/963,832, filed Dec. 9, 2015, McCamy et al, Article With Transparent Conductive Layer and Method of Making the Same.

* cited by examiner

ARTICLE WITH BUFFER LAYER AND METHOD OF MAKING THE SAME

CROSS-REFERENCE TO RELATED APPLICATION

This application claims priority to Provisional Application No. 62/131,938, filed Mar. 12, 2015, which is herein incorporated by reference in its entirety.

NOTICE OF GOVERNMENT SUPPORT

This invention was made with Government support under Contract No. DE-EE0004736 awarded by the Department of Energy. The United States government may have certain rights in this invention.

BACKGROUND OF THE INVENTION

1. Field of the Invention

This invention relates generally to electronic devices, for example solar cells, and to methods of making the same.

2. Technical Considerations

A solar cell or photovoltaic (PV) cell is an electronic device that directly converts sunlight into electricity. Light shining on the solar cell produces both a current and a voltage to generate electric power. In a solar cell, photons from sunlight are adsorbed by a semiconducting material. Electrons are knocked loose from their atoms, causing an electric potential difference. Current flows through the semiconductor material to cancel the potential difference. Due to the special composition of solar cells, the electrons are only allowed to move in a single direction.

A typical solar cell includes a glass substrate (cover plate) over which is provided a barrier layer, a transparent conductive oxide contact layer, and a semiconductor layer. A rear metallic layer acts as a reflector and back contact Light scattering or "haze" is used to trap light in the active region of the cell. The more light that is trapped in the cell, the higher the efficiency that can be obtained. However, the haze cannot be so great as to adversely impact upon the transmittance of light through the conductive oxide layer.

It is also desirable that the conductive oxide layer is highly transparent to permit the maximum amount of solar radiation to pass to the semiconductor layer. As a general rule, the more photons that arrive at the semiconductor material, the higher the efficiency of the cell. Further, the conductive oxide layer should be highly conductive to facilitate the transfer of electrons in the cell.

Articles such as Organic Light Emitting Diodes (OLED) and Light Emitting Diodes (LED) also utilize conductive oxide layers and would benefit from enhanced haze and/or high transparency.

It would be desirable to provide a conductive oxide layer having enhanced conductivity and/or light transmission and/ or light scattering. It would be desirable to provide a method of modifying a conductive oxide layer to affect (e.g., increase or decrease) one or more of these factors. It would be desirable to provide a conductive oxide layer useful in solar cells, OLEDs, LEDs, as well as other electronic devices. It would be desirable to provide a coater useful for manufacturing solar cells, OLEDs, LEDs, as well as other electronic devices. It would be desirable to provide a method of coating a glass substrate on one or both major surfaces to provide a coated substrate useful in solar cells, OLEDs, LEDs, as well as other electronic devices. It would be desirable to provide an article and/or method to accomplish one or more of the above results.

SUMMARY OF THE INVENTION

A solar cell comprises a first substrate having a first surface and a second surface. An underlayer is located over the second surface. A first conductive layer is located over the underlayer. An overlayer is located over the first conductive layer. A semiconductor layer is located over the conductive oxide layer. A second conductive layer is located over the semiconductor layer. The first conductive layer comprises a conductive oxide and at least one dopant selected from the group consisting of tungsten, molybdenum, niobium, and/or fluorine. For example, the first conductive layer can comprise tin oxide doped with tungsten.

A transparent conductive oxide layer for a solar cell comprises a metal oxide doped with tungsten. For example, tin oxide doped with tungsten.

A vapor deposition coater comprises a plenum assembly comprising an inlet plenum and an exhaust plenum; and a nozzle block comprising a discharge face. A discharge channel is in flow communication with the inlet plenum. An exhaust conduit is in flow communication with the exhaust plenum. The discharge channel is angled with respect to the discharge face of the coating block.

A method of forming a coating on a glass substrate in a glass manufacturing system comprises: providing a first coating precursor material to a first inlet plenum of a vapor deposition coater having a discharge face, wherein the first inlet plenum is in flow communication with a first discharge channel, and wherein the first discharge channel defines a first discharge path; and providing a second coating precursor material to a second inlet plenum of the vapor deposition coater, wherein the second inlet plenum is in flow communication with a second discharge channel, and wherein the second discharge channel defines a second discharge path. The first discharge path intersects the second discharge path at a position selected from (a) above a surface of a glass ribbon or (b) at a surface of a glass ribbon or (c) below a surface of a glass ribbon.

A drawdown assembly comprises a receiver and a nanoparticle deposition device, such as a flame spray device, located adjacent a first side and/or a second side of a glass ribbon path.

A method of forming a coated glass article in a drawdown process comprises: locating at least one second coater adjacent a second side of a glass ribbon path; optionally, locating at least one first coater adjacent a first side of the glass ribbon path; and using the second coater and optional first coater to apply a coating on a second side of a glass ribbon and, optionally, on the first side of the glass ribbon.

A double sided coated article formed by a drawdown process comprises a glass substrate having a first surface and an opposed second surface. A first coating is formed over the first surface by a first chemical vapor deposition coater adjacent the first surface. A second coating is formed over the second surface by a second chemical vapor deposition coater adjacent the second surface. An internal light extraction region is formed on and/or in the second surface of the glass substrate.

BRIEF DESCRIPTION OF THE DRAWINGS

A complete understanding of the invention will be obtained from the following description when taken in connection with the accompanying drawing figures.

DESCRIPTION OF THE PREFERRED EMBODIMENT

Figure 1:
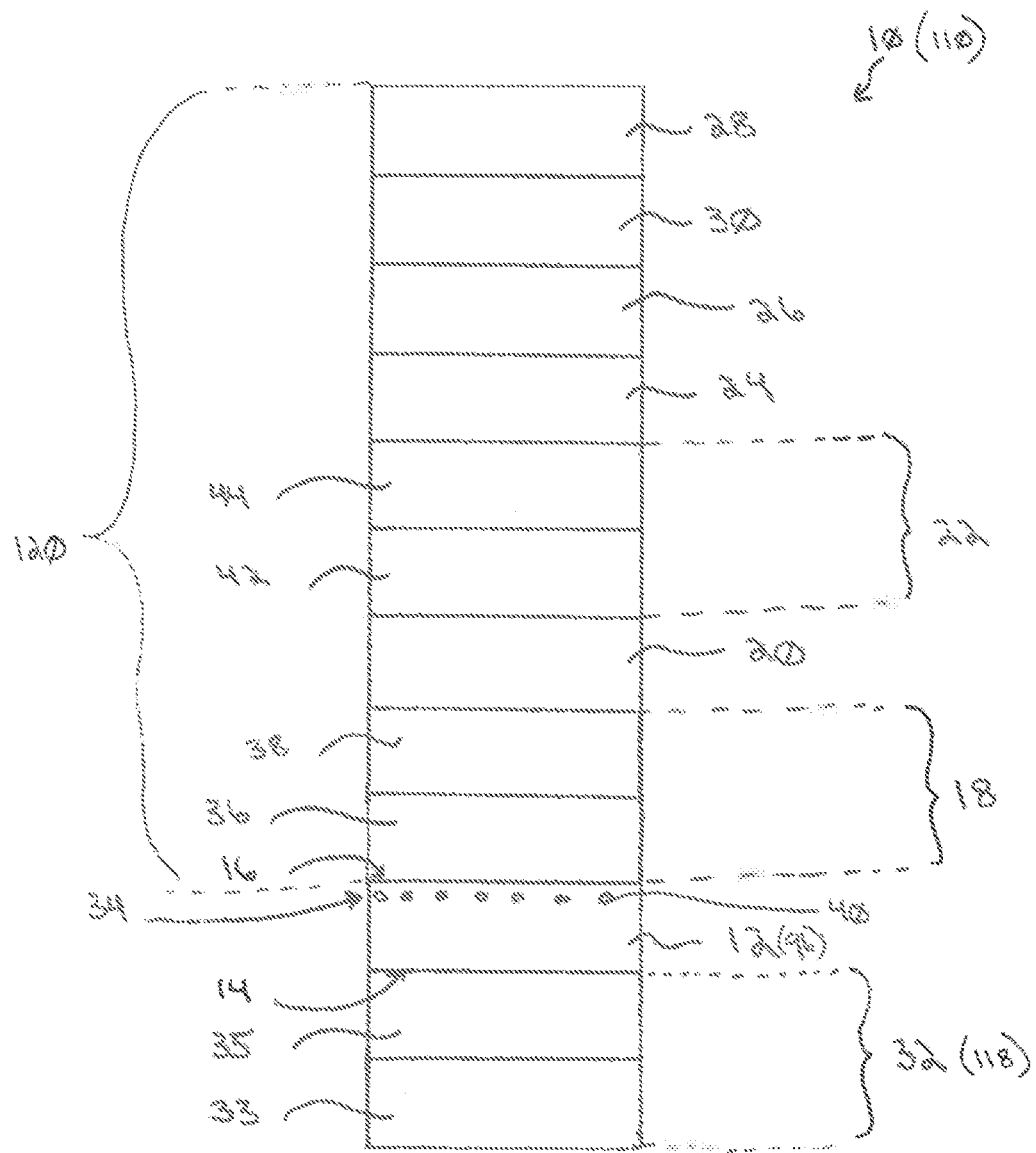
FIG. 1 is a side, sectional view of an article in the form of a solar cell incorporating features of the invention.

Spatial or directional terms used herein, such as "left", "right", "inner", "outer", and the like, relate to the invention as it is shown in the drawing figures. It is to be understood that the invention can assume various alternative orientations and, accordingly, such terms are not to be considered as limiting.

All numbers used in the specification and claims are to be understood as being modified in all instances by the term "about". All ranges disclosed herein are to be understood to encompass the beginning and ending range values and any and all subranges subsumed therein. The ranges set forth herein represent the average values over the specified range.

When referring to a layer of a coating, the term "over" means "farther from the substrate". For example, a second layer located "over" a first layer means that the second layer is located farther from the substrate than the first layer. The second layer can be in direct contact with the first layer or one or more other layers can be located between the second layer and the first layer.

The terms "polymer" or "polymeric" include oligomers, homopolymers, copolymers, and terpolymers.

All documents referred to herein are to be considered to be "incorporated by reference" in their entirety.

Any reference to amounts, unless otherwise specified, is "by weight percent".

The term "film" means a region having a desired or selected composition. A "layer" comprises one or more "films". A "coating" is comprised of one or more "layers". The term "organic material" includes polymers as well as small molecule organic materials that can be used to fabricate organic opto-electronic devices.

The term "visible light" means electromagnetic radiation having a wavelength in the range of 380 nm to 780 nm. The term "infrared radiation" means electromagnetic radiation having a wavelength in the range of greater than 780 nm to 100,000 nm. The term "ultraviolet radiation" means electromagnetic energy having a wavelength in the range of 100 nm to less than 380 nm.

The terms "metal" and "metal oxide" include silicon and silica, respectively, as well as traditionally recognized metals and metal oxides, even though silicon may not be conventionally considered a metal. The term "curable" means a composition capable of polymerizing or crosslinking. By "cured" is meant that the material is at least partly polymerized or cross-linked, preferably fully polymerized or cross-linked. By "at least" is meant "greater than or equal to". By "not more than" is meant "less than or equal to". The terms "upstream" and "downstream" refer to the direction of travel of the glass ribbon.

Haze and transmittance values herein are those determined using a Haze-Gard Plus hazemeter (commercially available from BYK-Gardner USA) or a Perkin Elmer Lamda 9 Spectrophotometer. Sheet resistance values were determined using a four-point probe (e.g., Nagy Instruments SD-600 measurement device). Surface roughness values were determined using an Instrument Dimension 3100 Atomic Force Microscope.

The discussion of the invention may describe certain features as being "particularly" or "preferably" within certain limitations (e.g., "preferably", "more preferably", or "even more preferably", within certain limitations). It is to be understood that the invention is not limited to these particular or preferred limitations but encompasses the entire scope of the disclosure.

The invention comprises, consists of, or consists essentially of, the following aspects of the invention, in any combination. Various aspects of the invention are illustrated in separate drawing figures herein. However, it is to be understood that this is simply for ease of illustration and discussion. In the practice of the invention, one or more aspects of the invention shown in one drawing figure can be combined with one or more aspects of the Invention shown in one or more of the other drawing figures.

The invention will be described with respect to a solar cell. However, it is to be understood that the invention could be practiced with other devices, for example, photovoltaic cells, organic light-emitting diodes, light emitting diodes, visual displays, and/or electronic switches.

An exemplary article, in the form of a solar cell 10, incorporating features of the invention is shown in FIG. 1. The solar cell 10 includes a first (outer) substrate 12 having a first (outer) major surface 14 and a second (Inner) major surface 16. By "outer" is meant the surface facing the incident radiation, e.g., sunlight. An underlayer 18 is located over the second surface 16. A first conductive layer 20 is located over the underlayer 18. An overlayer 22 is located over the first conductive layer 20. A semiconductor layer 24 is located over the overlayer 22. A second conductive layer 26 is located over the semiconductor layer 24. An optional second (inner) substrate 28 can be located over the second conductive layer 26. For example, the second substrate 28 can be connected to the second conductive layer 26 by a polymeric interlayer 30. An optional functional layer 32 can be located over the first surface 14 of the substrate 12. An optional internal light extraction region or layer 34 can be located in and/or on the substrate 12.

The first substrate 12 preferably has a high visible light transmission. By "high visible light transmission" is meant a visible light transmission at a reference wavelength of 550 nanometers (nm) and a reference thickness of 2 mm of at least 85%, such as at least 87%. For example, such as at least 90%. For example, such as at least 91%. For example, such as at least 92%. For example, such as at least 93%.

The first substrate 12 can be a low iron glass. By "low iron" is meant having a total Iron content of less than 400 parts per million (ppm), such as less than 350 ppm. For example, the total iron content can be less than 300 ppm. For example, the total iron content can be less than 200 ppm.

Examples of suitable materials for the first substrate 12 include soda-lime silicate glass, for example, float glass.

Examples of glass that can be used for the invention include Starphire, Solarphire®, Solarphire® PV, and CLEAR™ glass, all commercially available from PPG Industries, Inc. of Pittsburgh, Pa.

The first substrate 12 can be of any desired thickness. For example, the first substrate 12 can have a thickness in the range of 0.5 mm to 10 mm, such as 1 mm to 10 mm, such as 1 mm to 4 mm. For example, the first substrate 12 can have a thickness in the range of 2 mm to 3.2 mm.

The underlayer 18 can be a single layer, a homogeneous layer, a gradient layer, or can include a plurality of layers. By "homogeneous layer" is meant a layer in which the materials are randomly distributed throughout the coating. By "gradient layer" is meant a layer having two or more components, with the concentration of the components varying (e.g., continually changing or step change) as the distance from the substrate 12 changes.

The underlayer 18 can be or can include an optional bottom optical layer 36. The bottom optical layer 36 can include one or more metal oxide layers. Examples of suitable oxide materials include oxides of silicon, titanium, aluminum, zirconium, phosphorus, hafnium, niobium, zinc, bismuth, lead, indium, tin, and/or alloys and/or mixtures thereof. For example, the bottom optical layer 38 can include an oxide of zinc, silicon, tin, aluminum, and/or titanium. For example, the bottom optical layer 36 can include an oxide of zinc and/or tin.

A zinc target to sputter a zinc oxide film may include one or more other materials to improve the sputtering characteristics of the zinc target. For example, the zinc target can include up to 10 wt. %, such as up to 5 wt %, of such a material. The resultant zinc oxide layer would include a small percentage of an oxide of the added material, e.g., up to 10 wt. % of the material oxide, e.g., up to 5 wt. % of the material oxide. A layer deposited from a zinc target having up to 10 wt. % of an additional material to enhance the sputtering characteristics of the zinc target is referred to herein as "a zinc oxide layer" even though a small amount of the added material (or an oxide of the added material) may be present. An example of such a material is tin.

The bottom optical layer 36 can include or can be a zinc stannate layer. By "zinc stannate" is meant a composition of the formula: $Zn_xSn_{1-x}O_{2-x}$ (Formula 1) where "x" varies in the range of greater than 0 to less than 1. For instance, "x" can be greater than 0 and can be any fraction or decimal between greater than 0 to less than 1. A zinc stannate layer has one or more of the forms of Formula 1 in a predominant amount. A zinc stannate layer in which $x=\frac{2}{3}$ is conventionally referred to as "$Zn_2SnO_4$".

The underlayer 18 can be or can include an optional sodium ion barrier layer 38. Examples of suitable materials for the sodium ion barrier layer 38 include metal oxide and metal alloy oxide materials. For example, oxides of silicon, titanium, aluminum, zirconium, phosphorus, hafnium, niobium, zinc, bismuth, lead, indium, tin, and alloys and mixtures thereof. For example, the sodium ion barrier layer 38 can comprise silicon oxide. For example, the sodium ion barrier layer 38 can comprise a mixture of at least silica and titania. For example, the sodium ion barrier layer 38 can comprise a mixture of silica, titania, and phosphorous oxide.

In FIG. 1, the sodium ion barrier layer 38 is illustrated over the bottom optical layer 36. However, alternatively, the sodium ion barrier layer 38 could be positioned between the first substrate 12 and the bottom optical layer 36.

The underlayer 18 can comprise both the optional bottom optical layer 36 and the optional sodium ion barrier layer 38. Alternatively, only one of the bottom optical layer 36 or the sodium ion barrier layer 38 may be present.

The underlayer 18 can have a thickness in the range of 10 nm to 500 nm, such as 20 nm to 400 nm. For example, such as 20 nm to 300 nm.

The first conductive layer 20 can be a single layer or can have multiple layers or regions. The first conductive layer 20 comprises at least one conductive oxide layer. For example, the first conductive layer 20 can comprise a doped oxide layer. For example, the first conductive layer 20 can include one or more metal oxide materials. For example, the first conductive layer 20 can include one or more oxides of one or more of Zn, Fe, Mn, Al, Ce, Sn, Sb, Hf, Zr, Ni, Zn, Bi, Ti, Co, Cr, Si, In, or an alloy of two or more of these materials, such as zinc stannate. For example, the first conductive layer 20 can comprise tin oxide.

The first conductive layer 20 can include one or more dopant materials, such as but not limited to, F, In, Al, P, Cu, Mo, Ta, Ti, Ni, Nb, W, Ga, Mg, and/or Sb. For example, the dopant can be W, Mo, Nb, and/or F. For example, the dopant can be W or F. For example, the dopant can be W.

For example, the first conductive layer 20 can comprise W and an oxide material. For example, the first conductive layer can comprise tin oxide doped with tungsten.

The dopant can be present in an amount less than 10 wt. %, such as less than 5 wt. %, such as less than 4 wt. %, such as less than 2 wt. %. For example, such as less than 1 wt. %. For example, less than 0.5 wt. %. For example, less than 0.1 wt. %.

The first conductive layer 20 can be a multilayer comprising a first layer or region and a second layer or region located over the first layer. For example, the first layer or region can be tungsten doped tin oxide. For example, the second layer or region can be fluorine doped tin oxide.

The first conductive layer 20 can have a thickness in the range of 150 nm to 700 nm, such as 200 nm to 600 nm, such as 200 nm to 500 nm. For example, the first conductive layer 20 can have a thickness in the range of 200 nm to 450 nm.

The first conductive layer 20 can have a sheet resistance in the range of 8 ohms per square ($\Omega/\square$) to $25\Omega/\square$, such $10\Omega/\square$ to $20\Omega/\square$. For example, such as $10\Omega/\square$ to $17\Omega/\square$.

The first conductive layer 20 can have a surface roughness (RMS) in the range of 5 nm to 60 nm, such as 5 nm to 40 nm, such as 5 nm to 30 nm, such as 10 nm to 30 nm, such as 10 nm to 20 nm. For example, such as 10 nm to 15 nm. For example, such as 11 nm to 15 nm.

The overlayer 22 can be a homogeneous layer, a gradient layer, and/or can include a plurality of layers or films.

The overlayer 22 can be or can include an optional buffer layer 42. The buffer layer 42 can improve the amount of electromagnetic energy to the semiconductor layer 24.

The buffer layer 42 can include one or more oxide materials. Examples of materials suitable for the buffer layer 42 include oxides of silicon, titanium, aluminum, zirconium, phosphorus, hafnium, magnesium, niobium, zinc, bismuth, gallium, lead, indium, and/or tin, and/or alloys and/or mixtures thereof. For example, the buffer layer 42 can comprise an oxide of zinc, indium, gallium, and/or tin. For example, the buffer layer 42 can comprise tin oxide.

The buffer layer 42 can include one or more other materials doped with or alloyed with the oxide materials. Examples of the other materials include zinc, magnesium, and/or tin.

For example, the buffer layer 42 can comprise zinc stannate. For example, the buffer layer 42 can comprise tin oxide doped with zinc and/or magnesium. For example, the buffer layer 42 can comprise tin oxide doped with zinc.

The overlayer 22 can be or can include an optional insulating layer 44. Suitable materials for the insulating layer 44 include cadmium sulfide and/or a cadmium sulfate. An Insulating layer 44 is particularly useful for a cadmium telluride solar cell.

The overlayer 22 can comprise both the optional buffer layer 42 and the optional Insulating layer 44. Alternatively, only one of the optional buffer layer 42 and the optional Insulating layer 44 may be present.

The overlayer 22 can have thickness in the range of 20 nm to 500 nm, such as 20 nm to 400 nm, such as 20 nm to 300 nm. For example, the overlayer 22 can have thickness in the range of 20 nm to 200 nm.

The semiconductor layer 24 can comprise any conventional solar cell semiconductor material. Examples of semiconductor material include monocrystalline silicon, polycrystalline silicon, amorphous silicon, cadmium telluride, and/or copper indium celenide/sulfide.

The semiconductor layer 24 can have a thickness in the range of 200 nm to 1,000 nm, such as 200 nm to 800 nm, such as 300 nm to 500 nm. For example, such as 300 nm to 400 nm. For example, such as 350 nm.

The second conductive layer 26 is preferably a metal layer. Examples of suitable materials for the second conductive layer 26 include silver, barium, calcium, and magnesium. The second conductive layer 26 can be a relatively thick layer. For example, the second conductive layer 26 can be opaque to light having a wavelength of 550 nm. By "opaque" is meant having a transmittance at a wavelength of 550 nm of less than 10%, such as less than 5%, such as less than 3%. For example, such as less than 1%. For example, 0%.

The optional second substrate 28 can be of any material described above for the first substrate 12. The first substrate 12 and second substrate 28 can be of the same or different materials and can be of the same or different thicknesses. For example, the second substrate 28 can comprise float glass.

The interlayer 30 can be an elastomeric polymer. Examples include ethylene vinyl acetate (EVA) and polyvinyl butyral (PVB).

The optional functional layer 32 can be a homogeneous layer, a gradient layer, and/or can include a plurality of layers or films.

The optional functional layer 32 can be or can include an optional antireflective layer 33. For example, the antireflective layer 33 can be a single layer or can comprise multiple films of antireflective materials and/or dielectric materials. Examples include metal oxides, oxides of metal alloys, nitrides, oxynitrides, or mixtures thereof. Examples of suitable metal oxides for the antireflective layer 33 include oxides of titanium, hafnium, zirconium, niobium, zinc, bismuth, lead, indium, tin, and/or mixtures thereof. These metal oxides can have small amounts of other materials, such as manganese in bismuth oxide, tin in indium oxide, etc. Additionally, oxides of metal alloys or metal mixtures can be used, such as oxides containing zinc and tin (e.g., zinc stannate), oxides of indium-tin alloys, silicon nitrides, silicon aluminum nitrides, or aluminum nitrides. Further, doped metal oxides, such as antimony or indium doped tin oxides or nickel or boron doped silicon oxides, can be used.

The antireflective layer 33 can have a thickness in the range of 5 nm to 600 nm, such as 10 nm to 500 nm, such as 20 nm to 400 nm, such as 25 nm to 300 nm, such as 25 nm to 200 nm, such as 25 nm to 100 nm. For example, such as 25 nm to 50 nm. For example, such as 30 nm to 40 nm.

The optional functional layer 32 can be or can include an optional external extraction layer 35. The external extraction layer 35 can be formed by a coating, such as a metal oxide coating, having a roughened exterior surface. Examples of oxides useful for the external extraction layer 35 include silica, alumina, zinc oxide, titania, zirconia, tin oxide, and/or mixtures thereof.

The external extraction layer 35 can have an average surface roughness (Ra) in the range of 5 nm to 500 nm, such as 5 nm to 500 nm, such as 50 nm to 500 nm. For example, such as 50 nm to 200 nm. For example, such as 100 nm to 200 nm.

The external extraction layer 35 can have a root mean square roughness (Rq) in the range of 100 nm to 250 nm. For example, such as 150 nm to 200 nm.

The external extraction layer 35 can have a thickness in the range of 10 nm to 500 nm, such as 50 nm to 500 nm. For example, such as 100 nm to 500 nm. The external extraction layer 35 can be a single layer or optionally a multilayer coating.

The optional functional layer 32 can comprise both the antireflective layer 33 and the external extraction layer 35. Alternatively, the optional functional layer 32 can comprise only one of the antireflective layer 33 and the external extraction layer 35. Alternatively, the functional layer 32 may not be present.

One or more of the layers described above can be formed by any conventional coating methods. Examples include spray pyrolysis; vapor deposition, such as chemical vapor deposition (CVD), packed-bed vaporization, flat-bed vaporization, and falling film vaporization; and/or magnetron sputtered vacuum deposition (MSVD). The layers can all be formed by the same method or different layers can be formed by different methods. For example, one or more of the layers can be formed by a CVD method while one or more other layers can be formed by MSVD or spray pyrolysis, for example.

For example, one or more of the layers or regions can be formed in a float glass process. In another example, one or more of the layers or regions can be formed in a drawdown process.

In a float glass process, glass batch materials are melted in a furnace and poured onto the top of a pool of molten metal in a float bath. The glass melt spreads across the surface of the molten metal to form a glass ribbon. The glass ribbon exits the float bath and can be conveyed to a lehr for controlled cooling. One or more coaters, such as chemical vapor deposition (CVD) coaters or flame spray devices, can be located in the float bath.

Figure 2:
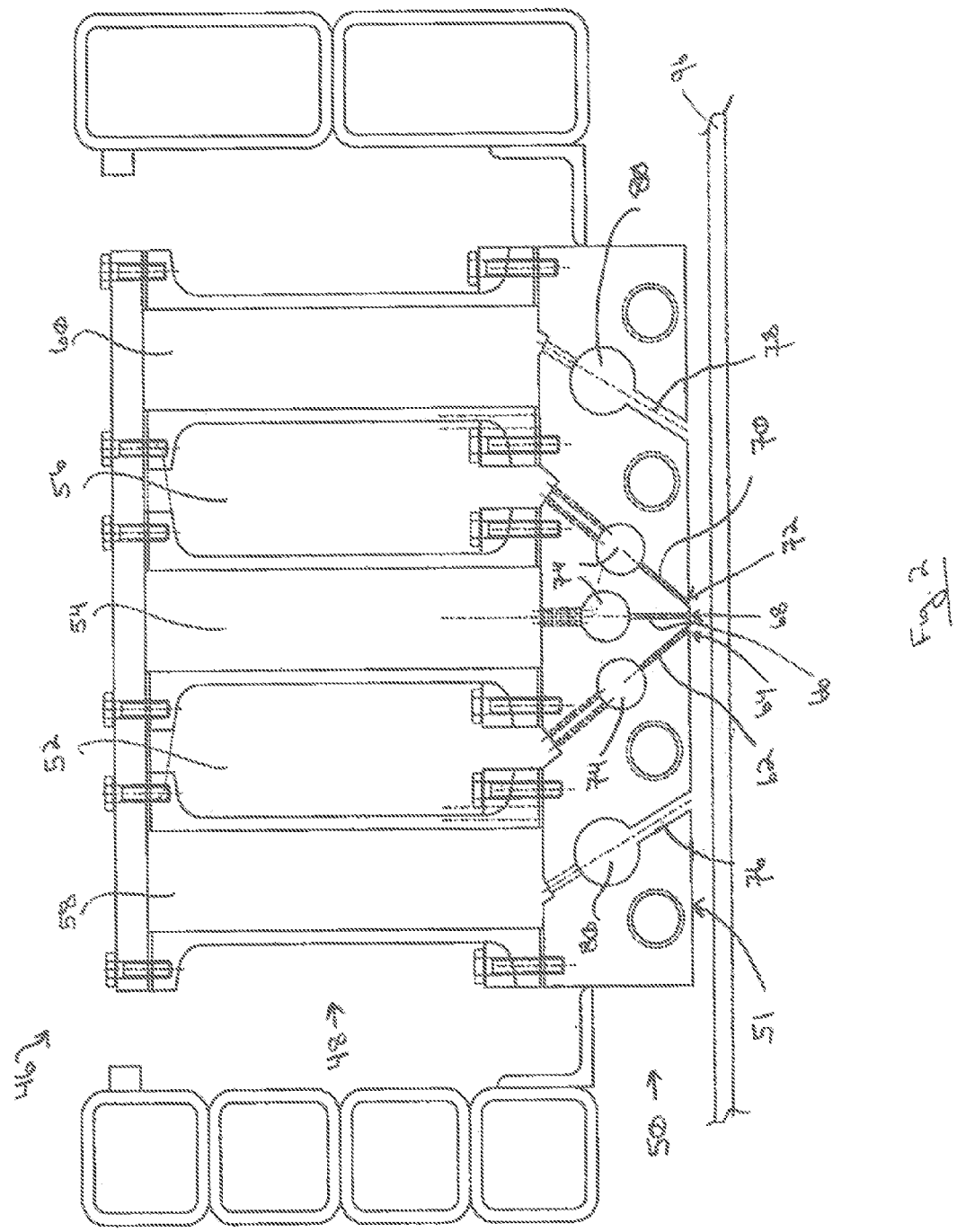
FIG. 2 is a side, sectional view of a chemical vapor deposition (CVD) coater incorporating features of the invention.

A CVD coater 46 particularly well suited for applying volatile precursors is shown in FIG. 2. The coater 46 includes a plenum assembly 48 and a nozzle block 50. The nozzle block 50 has a discharge face 51 directed toward the substrate to be coated, e.g., a glass ribbon 96. The illustrated exemplary plenum assembly 48 has a first inlet plenum 52, a second inlet plenum 54, and a third inlet plenum 56. The plenum assembly 48 has a first exhaust plenum 58 and a second exhaust plenum 60. The exemplary nozzle block 50 is connected to the plenum assembly 48, such as by bolts.

The first inlet plenum 52 is in flow communication with a first discharge channel 62 having a first discharge outlet (slot) 64. The second inlet plenum 54 is in flow communication with a second discharge channel 66 having a second discharge outlet (slot) 68. The third inlet plenum 56 is in flow communication with a third discharge channel 70 having a third discharge outlet (slot) 72. Inlet mixing chambers 74 can be located in the discharge channels.

A first exhaust conduit 76 extends from the discharge face 51 to the first exhaust plenum 58. A second exhaust conduit 78 extends from the discharge face 51 to the second exhaust plenum 60. Exhaust chambers 80 can be located in the exhaust conduits 76, 78.

In the illustrated example, the second discharge channel 66 is perpendicular to the discharge face 51 (i.e. a centerline axis of the second discharge channel 66 is perpendicular to the plane of the discharge face 51). However, the first discharge channel 62 and third discharge channel 70 are angled with respect to the discharge face 51. The centerline axes of the first discharge channel 62 and the third discharge channel 70 intersect at a position below the discharge face 51. Thus, the precursor vapors from the discharge outlets 64, 68, 72 are not mixed until after discharge from the nozzle block 50. This is particularly useful for volatile precursors where premixing of the precursors would cause premature reaction.

The angle of one or more of the discharge channels 62, 66, 70 with respect to the discharge face 51 can be changed so that the centerline axes of two or more of the discharge channels 62, 66, 70 intersect at a desired location (e.g., distance from the discharge face 51 and/or location with respect to an underlying substrate). For example, different nozzle blocks 50 having different discharge channel angles can be provided. A nozzle block 50 having the desired discharge channel angles can be selected and bolted onto the plenum assembly 48. Alternatively, the nozzle block 50 can be formed by separate sections. The first exhaust conduit 76 can be in one section, the second exhaust conduit 78 can be in another section, and the discharge channels 62, 66, 70 can be in a third section. The different sections can be individually connectable with the plenum assembly 48. In this aspect, only the section of the nozzle block 50 with the discharge channels 62, 66, 70 would need to be replaced with a section having a desired discharge channel angle. Alternatively, the first discharge channel 62, second discharge channel 66, and third discharge channel 70 can be located in separate sections of the nozzle block 50 and movably connected, for example slidably connected, to the plenum assembly 48. For example, with reference to FIG. 2, if the first discharge channel 62 is located in one slidable section and the third discharge channel 70 is located in a separate slidable section, sliding the slidable section containing the first discharge channel and/or the other slidable section containing the third discharge channel 70 to the left or the right with reference to FIG. 2 would change the point of intersection of the centerlines of the discharge channels. For example, sliding the section containing the first discharge channel 62 to the left and sliding the section containing the third discharge channel 70 to the right in FIG. 2 would increase the distance of the point of intersection with respect to the discharge face 51.

The angles of the discharge channels 62 and/or 70 can be varied such that the centerline axes intersect above the surface of the substrate, e.g., glass ribbon 96, or at the surface of the substrate, or below the surface of the substrate. If the calculated intersection is below the surface of the substrate, the vapors from the second discharge channel 68 perpendicular to the discharge face 51 form a monolayer on the glass ribbon and the material from the first discharge channel 62 and third discharge channel 70 react with it. In FIG. 2, the centerline axes of the discharge channels would intersect above the glass ribbon 96.

Figure 3:
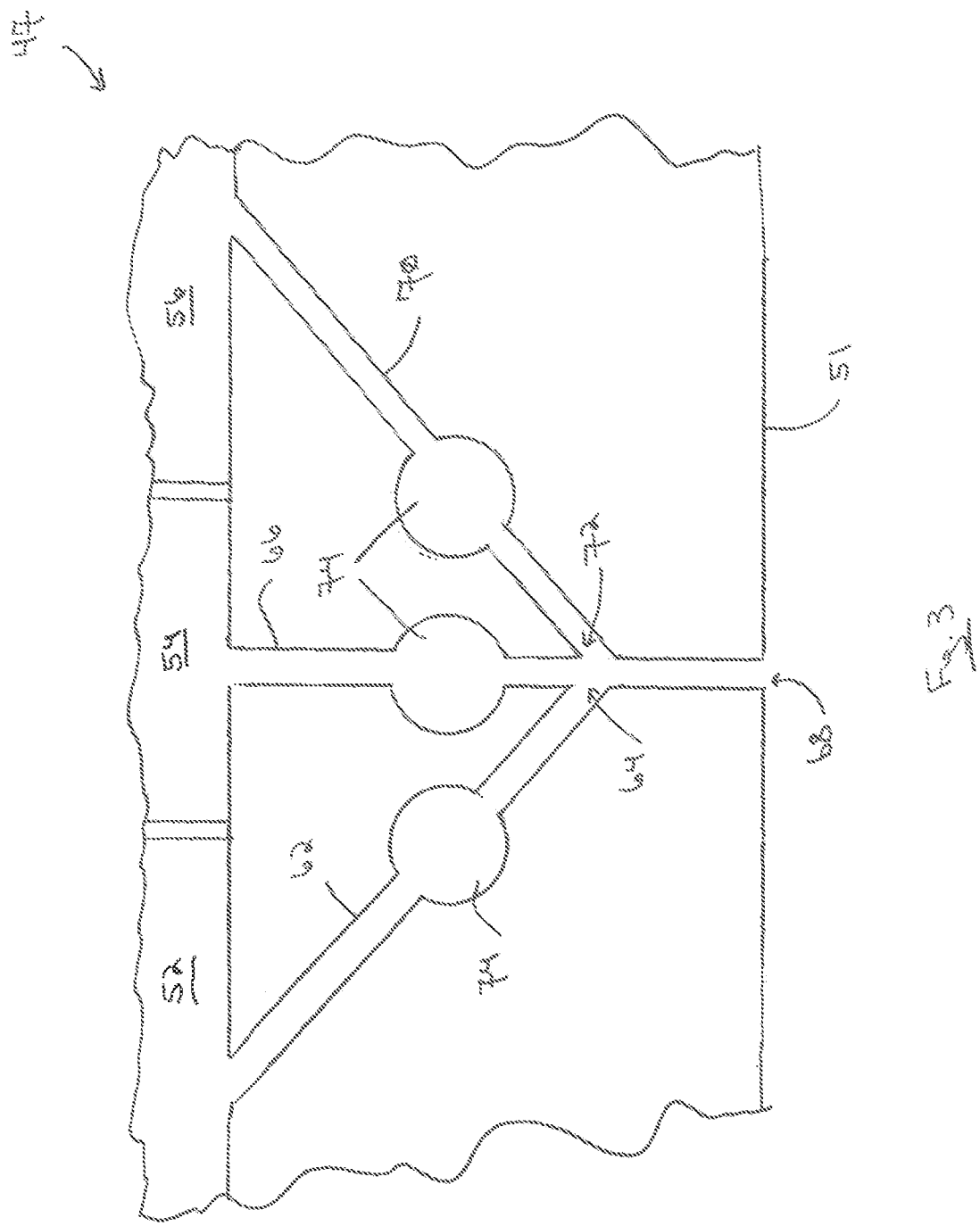
FIG. 3 is a side, sectional view of a nozzle block of a modified CVD coater having a modified discharge channel arrangement.

A central portion of a modified nozzle block 50 of a modified coater 47 is shown in FIG. 3. In this modification, the first discharge outlet 64 and third discharge outlet 72 are in flow communication with the second discharge channel 66 above the discharge face 51. Thus, the vapors from the three discharge channels mix before they are discharged from the second discharge outlet 68.

A coater 46, 47 having multiple discharge slots is particularly useful for applying one or more of the layers described above.

One or more of the above-described layers can be made by selective deposition of multiple precursor materials. For example, the first conductive layer 20 can be formed using two or more different precursor materials. Tin oxide coatings made with monobutyltin trichoride (MBTC) typically provide coatings with lower haze than other tin precursors, such as tin tetrachloride (TTC). However, the deposition efficiency for TTC is better than MBTC. Also, TTC tends to produce a coating with a lower sheet resistance than a coating made from MBTC. Therefore, the first conductive layer 20 can initially be formed using MBTC (for haze) and then the precursor material switched to TTC to form the remainder of the first conductive layer 20. The overall efficiency is increased and the resultant coating has the haze benefits of MBTC and the sheet resistance benefits of TTC.

For another example, the first conductive layer 20 can be formed using MBTC and dibutyltin diacetate (DBTA). Tin coatings formed with MBTC typically have a higher surface roughness than tin coatings formed with DBTA. However, DBTA has a slower deposition rate. If MBTC is mixed with DBTA, the resultant coating is smoother than with MBTC alone and the deposition rate is not as low as with DBTA alone.

The first conductive layer 20 can be formed having multiple layers and or regions. For example, a first region of the first conductive layer 20 can be formed using a tin precursor and a tungsten precursor to provide a tungsten doped tin oxide coating. For example, the tin precursor can be MBTC or TTC. The tungsten precursor can be tungsten tetrachloride. For example, a second region of the first conductive layer 20 can then be deposited using a tin precursor and a fluorine precursor to provide a fluorine doped tin oxide region.

The buffer layer 42 can be made using a tin precursor and a precursor for zinc or magnesium. For example, the tin precursor can be MBTC or TTC. The zinc precursor can be diethylzinc (DEZ), dimethyl zinc (DMZ), zincacetyl acetate, or alkzinc alkoxide. The magnesium precursor can be bis(cyclopentadienyl)magnesium. For example, the buffer layer 42 can be made using magnesium chloride mixed with MBTC.

Figure 4:
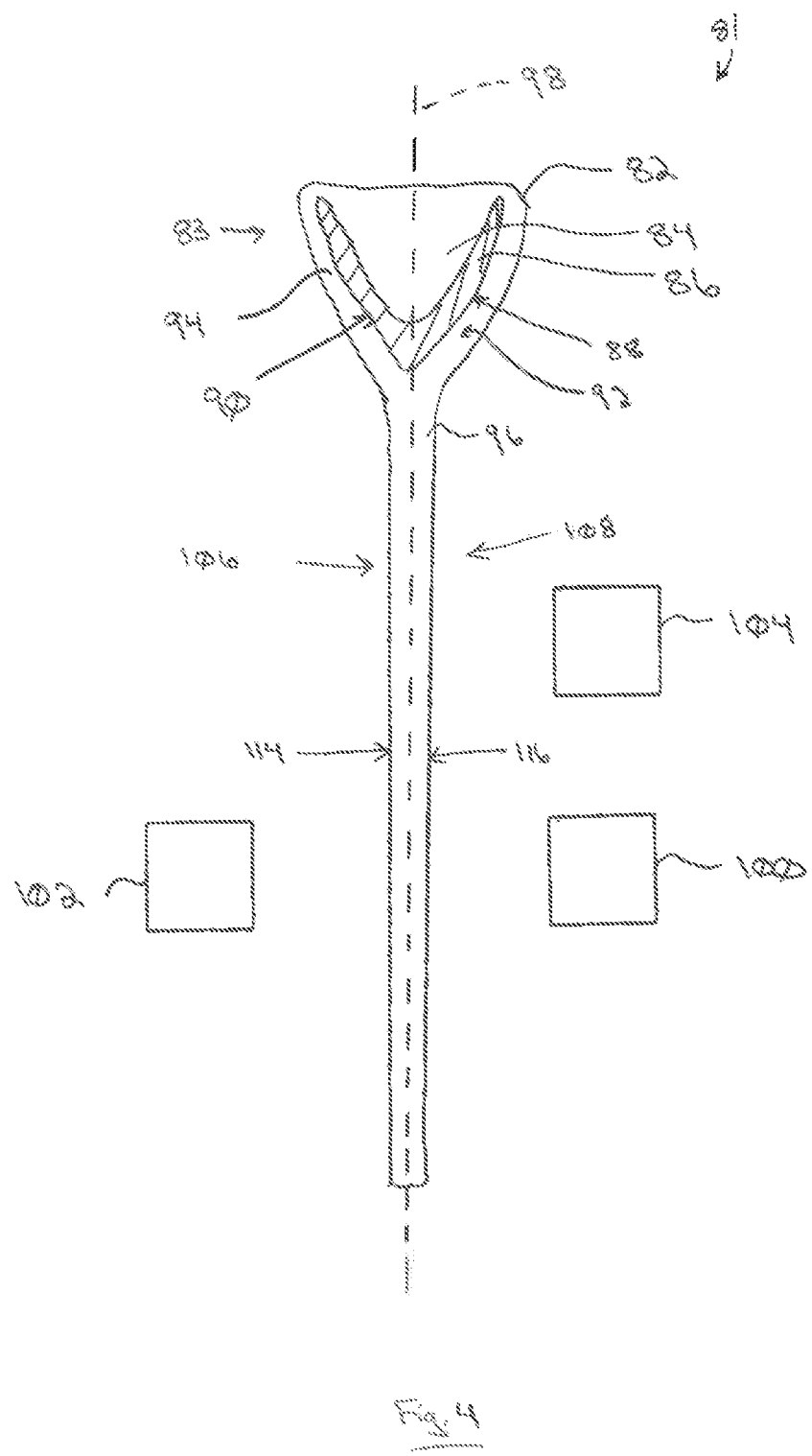
FIG. 4 is an end, sectional view of a glass drawdown process incorporating features of the invention.

The invention is not limited to the float glass process. One or more of the layers can be formed using a glass drawdown manufacturing process. In a drawdown process, molten glass is located in a receiver. The molten glass flows out of the receiver and forms a glass ribbon, which moves downwardly under the influence of gravity. Examples of drawdown processes include a slot drawdown process and a fusion drawdown process. In a slot drawdown process, the receiver is an elongated trough having an open discharge slot in the bottom of the trough. Molten glass flows through the discharge slot to form the glass ribbon. In a fusion drawdown process, the receiver is a trough with an open top. Molten glass flows out of the top of the trough, down the opposed outer sides of the trough, and forms a glass ribbon under the trough. FIG. 4 illustrates a drawdown assembly 81 configured as a fusion drawdown assembly. However, the drawdown assembly 81 could also be illustrated as a slot drawdown assembly.

In the exemplary fusion drawdown process illustrated in FIG. 4, molten glass 82 is located in a receiver 83 in the form of a forming trough 86 having a channel 84 and opposed sides 88, 90. The molten glass 82 overflows the channel 84 and forms two glass films 92, 94 that flow downwardly along the outer surfaces of the sides 88, 90, respectively, and join together under the trough 86 to form a glass ribbon 96. The glass ribbon 96 moves downwardly under the force of gravity. The vertical plane along which the glass ribbon 96 moves defines the glass ribbon path 98 for the drawdown process. The glass ribbon path 98 has a first side 106 and a second side 108, defining a first side 114 and a second side 116 of the glass ribbon 96, respectively. As discussed above, in a slot drawdown process, the receiver 83 would be in the form of an elongated trough having a slot in the bottom of the trough through which the glass ribbon 96 emerges.

One or more coaters are located adjacent the glass ribbon 96 (i.e. adjacent the glass ribbon path 98). The coaters can be, for example, CVD coaters and/or spray coaters and/or flame spray coaters and/or vapor coaters. In the illustrated example, at least one coater 100 is located adjacent the second side 116 of the glass ribbon. Optionally, at least one other coater 102 can be located adjacent the first side 114 of the glass ribbon 96. Thus, one or more of any of the above-described layers can be formed on one or both surfaces of the glass ribbon 96. For example, the coaters 100, 102 can be conventional CVD coaters. For example, one or more of the coaters 100, 102 can be the coater 46 or the coater 47 described above.

As shown in FIG. 1, the substrate 12 can include an optional internal light extraction region 34. The internal light extraction region 34 can be formed by nanoparticles 40 incorporated on the second surface 16 of the substrate 12 and/or embedded in or incorporated into a region of the glass adjacent the second surface 16. Examples of suitable nanoparticles 40 include, but are not limited to, oxide nanoparticles. For example but not limited to alumina, titania, cerium oxide, zinc oxide, tin oxide, silica, and zirconia. Other examples include metallic nanoparticles. For example but not limited to iron, steel, copper, silver, gold, and titanium. Further examples include alloy nanoparticles containing alloys of two or more materials. Additional examples include sulfide-containing nanoparticles and nitride-containing nanoparticles. These nanoparticles can be incorporated into the substrate 12 (e.g., glass ribbon 96) at a depth in the range of 0 microns to 50 microns, such as 0 microns to 10 microns, such as 0 micron to 5 microns. For example, such as 0 microns to 3 microns.

The nanoparticles can be incorporated onto and/or into the substrate 12 by propelling the nanoparticles from a coater toward the substrate 12. For example, in a float glass process, a flame spray device (or combustion deposition device) can be mounted in the float chamber upstream of the CVD coater in the float process described above. A suitable flame spray device is commercially available from Beneq-Oy Vantaa, Finland. Another suitable flame spray device is described in WO 01/28941. In the flame spray device, coating materials are atomized, combusted, and then sprayed directly onto the hot glass ribbon. The particles are formed on and/or diffused into the surface of the ribbon or penetrate the surface and are incorporated into the upper portion of the glass ribbon. These particles, such as metal oxide nanoparticles, are present on the surface of the glass or are diffused into the glass and react with the glass matrix. This process can be practiced at any suitable place in the float chamber but is believed to be more practical at locations where the temperature of the glass ribbon is in the range of 400° C. to 1,000° C., such as 500° C. to 900° C., such as 500° C. to 800° C., such as 600° C. to 800° C. For example, such as 700° C. to 800° C. After deposition of the nanoparticles on and/or in the surface, the glass ribbon can move under the CVD coater for the application of one or more coating layers described above.

In the drawdown process illustrated in FIG. 4, one or more flame spray devices 104 can be located adjacent the glass ribbon path 98. For example, the flame spray device(s) 104 can be located upstream of (i.e., above) one or both of the coaters 100, 102. The nanoparticles 40 can be deposited onto and/or into one or both sides 114, 1186 of the glass ribbon 96. Subsequently, one or more of the coating layers described above can be applied over one or both sides 114, 116 of the glass ribbon 96 by the coaters 100, 102. For example, the flame spray device 104 can deposit nanoparticles 40 onto and/or into the second side 116 of the glass ribbon 96 (e.g., corresponding to the second surface 16 of the substrate 12). Subsequently, one or more coaters 100 can apply one or more of the underlayer 18, and/or first conductive layer 20, and/or overlayer 22, and/or semiconductor layer 24, and/or second conductive layer 26 over the second side 116 of the glass ribbon 96. One or more second coaters 102 can apply the optional functional layer 32 over the first side 114 of the glass ribbon 96.

The nanoparticles can be produced by any conventional method. In one specific example, a liquid precursor can be heated in a vaporizer to form a vapor. The vapor can be directed to a reaction zone to form the desired nanoparticles. Examples of liquid reactant vaporizers are disclosed in U.S. Pat. Nos. 4,924,938, 5,356,451 and 7,730,747. For example, a metal chloride, such as titanium tetrachloride, can be heated in a vaporizer to form a precursor vapor. The vapor can be directed to an applicator or a collector. For example, the vaporizer can be connected to a flame spray device. The titanium tetrachloride vapor can be hydrolyzed or oxidized to form titanium dioxide nanoparticles. Other precursors, such as organometallic compounds, can be used. Titanium isopropoxide is an example of another material that can be vaporized to form titanium dioxide nanoparticles. The precursor stream may be composed of one, two or more liquid reactant materials of different compositions so as to form nanoparticles having a pure composition, a composition with mixed phases and/or compositions, or homogeneous alloys of a single or multiple phases. As will be appreciated by one skilled in the art, the liquid reactant materials can be supplied in various ratios to form nanoparticles of a desired composition. Further, one or more precursors may be supplied from a gaseous source to form nanoparticles of a desired composition. Examples of this include supplying hydrogen sulfide as a sulfur containing precursor to form a sulfide containing nanoparticle, or supplying ammonia (NH3) to form a nitride containing nanoparticle.

The invention can be described further in the following numbered clauses:

Clause 1: An article, for example a solar cell 10, comprising: a first substrate 12 having a first surface 14 and a second surface 16; an underlayer 18 located over the second surface 16; a first conductive layer 20 over the underlayer 18; an overlayer 22 over the first conductive layer 20; a semiconductor layer 24 over the first conductive layer 20; and a second conductive layer 26 over the semiconductor layer 24. The first conductive layer 20 comprises a conductive oxide and at least one dopant selected from the group consisting of tungsten, molybdenum, niobium, and/or fluorine.

Clause 2: The article of clause 1, wherein the first substrate 12 comprises low iron glass.

Clause 3: The article of clauses 1 or 2, wherein the underlayer 18 comprises a sodium ion barrier layer 38 comprising silicon oxide.

Clause 4: The article of any of clauses 1 to 3, wherein the underlayer 18 comprises a bottom optical layer 36 comprising an oxide of tin, zinc, silicon, aluminum, titanium, and/or mixtures thereof.

Clause 5: The article of any of clauses 1 to 4, wherein the underlayer 18 comprises a sodium barrier layer 38 comprising silicon oxide and a bottom optical layer 36 comprising oxides of tin and zinc.

Clause 6: The article of any of clauses 1 to 5, wherein the first conductive layer 20 comprises tin oxide and tungsten.

Clause 7: The article of any of clauses 1 to 6, wherein the first conductive layer 20 comprises a first layer comprising tin oxide and tungsten, and a second layer comprising tin oxide and fluorine.

Clause 8: The article of any of clauses 1 to 7, wherein the overlayer 22 comprises a buffer layer 42 comprising tin oxide and at least one of zinc, indium, gallium, magnesium, and nitrogen.

Clause 9: The article of any of clauses 1 to 8, wherein the overlayer 22 comprises a buffer layer 42 comprising tin oxide and zinc.

Clause 10: The article of any of clauses 1 to 9, wherein the overlayer 22 comprises an insulating layer 44 comprising cadmium sulfide and/or cadmium sulfate.

Clause 11: The article of any of clauses 1 to 10, wherein the overlayer 22 comprises a buffer layer 42 comprising tin oxide and zinc and/or magnesium, and an insulating layer 44 comprising cadmium sulfide and/or cadmium sulfate.

Clause 12: The article of any of clauses 1 to 11, wherein the semiconductor layer 24 comprises cadmium telluride.

Clause 13: The article of any of clauses 1 to 12, wherein the second conductive layer 26 comprises a metallic layer.

Clause 14: The article of any of clauses 1 to 13, wherein the second conductive layer 26 comprises silver.

Clause 15: The article of any of clauses 1 to 14, including a second substrate 28 over the second conductive layer 26, wherein the second substrate 28 comprises glass.

Clause 16: The article of any of clauses 1 to 15, including an internal light extraction region 34 in and/or on the second surface 16 of the first substrate 12. The internal light extraction region 34 can comprise nanoparticles.

Clause 17: The article of any of clauses 1 to 16, including a functional layer 32 over the first surface 14 of the first substrate 12, wherein the functional layer 32 is selected from the group consisting of an antireflective layer 33 and an external light extraction layer 35.

Clause 18: The article of clause 17, wherein the antireflective layer 33 comprises an oxide of a material selected from the group consisting of titanium, zirconium, zinc, tin, and mixtures thereof.

Clause 19: The article of clauses 17 or 18, wherein the external light extraction layer 35 is selected from the group consisting of silica, alumina, zinc oxide, titania, zirconia, tin oxide, and mixtures thereof.

Clause 20: The article of any of clauses 1 to 19, wherein the first conductive layer 20 comprises a first region deposited from a first precursor material and a second region deposited from a second precursor material.

Clause 21: The article of clause 20, wherein the first precursor material comprises MBTC and the second precursor material is selected from the group consisting of TTC and DBTA.

Clause 22: A transparent conductive oxide layer 20 for an article, for example a solar cell 10, comprising a tin oxide and tungsten, preferably tungsten doped tin oxide.

Clause 23: A vapor deposition coater 46, 47 comprising: a plenum assembly 48 comprising at least one inlet plenum 52, 54, 56 and at least one exhaust plenum 58, 60; and a nozzle block 50 comprising a discharge face 51, at least one discharge channel 62, 66, 70 in flow communication with the at least one inlet plenum 52, 54, 56, and at least one exhaust conduit 76 in flow communication with the at least one exhaust plenum 58, 60. The at least one discharge channel 62, 66, 70 is angled with respect to the discharge face 51 of the nozzle block 50.

Clause 24: The vapor deposition coater 46, 47 of clause 23, wherein the at least one exhaust conduit 76 is angled with respect to the discharge face 51.

Clause 25: The vapor deposition coater 48, 47 of clauses 23 or 24, including a first inlet plenum 52 in flow communication with a first discharge channel 62, a second inlet plenum 54 in flow communication with a second discharge channel 66, and a third inlet plenum 56 in flow communication with a third discharge channel 70, wherein at least one of the discharge channels 62, 66, 70 is angled with respect to the discharge face 51 and at least one of the discharge channels 62, 66, 70 is perpendicular to the discharge face 51.

Clause 26: The vapor deposition coater 46, 47 of any of clauses 23 to 25, including a first exhaust plenum 58 in flow communication with a first exhaust conduit 76 and a second exhaust plenum 60 in flow communication with a second exhaust conduit 78, wherein the first exhaust conduit 76 and the second exhaust conduit 78 are angled with respect to the discharge face 51.

Clause 27: The vapor deposition coater 46, 47 of any of clauses 23 to 26, including at least one mixing chamber 74 located in the discharge channels 62, 66 70 between the inlet plenums 52, 54, 56 and the discharge face 51.

Clause 28: The vapor deposition coater 46, 47 of any of clauses 23 to 27, including at least one exhaust chamber 80 located in the exhaust conduits 76, 78 between the exhaust plenum 58, 60 and the discharge face 52.

Clause 29: The vapor deposition coater 46, 47 of clause 25, wherein the first discharge channel 62 has a first discharge outlet 64, the second discharge channel 66 has a second discharge outlet 68, and the third discharge channel 70 has a third discharge outlet 72, wherein the first discharge outlet 64, the second discharge outlet 68, and the third discharge outlet 72 are located on the discharge face 51.

Clause 30: The vapor deposition coater 46, 47 of clause 25, wherein the first discharge channel 62 has a first discharge outlet 64, the second discharge channel 66 has a second discharge outlet 68, and the third discharge channel 70 has a third discharge outlet 72, wherein the second discharge outlet 68 is located on the discharge face 51, and wherein the first discharge outlet 64 and the third discharge outlet 72 are in flow communication with the second discharge channel 66 at a distance from the discharge face 51, for example, above the discharge face 51.

Clause 31: The vapor deposition coater 46, 47 of any of clauses 23 to 30, wherein the angle of at least one discharge channel 62, 66, 70 is adjustable with respect to the discharge face 51.

Clause 32: A method of forming a coating on a glass substrate, such as a glass ribbon 96, in a glass manufacturing process, comprising: providing a first coating precursor material to a first inlet plenum 52 of a vapor deposition coater 46, 47 having a discharge face 51, wherein the first inlet plenum 52 is in flow communication with a first discharge channel 62, and wherein the first discharge channel 62 defines a first discharge path; and providing a second coating precursor material to a second inlet plenum 54 of the vapor deposition coater 46, 47, wherein the second inlet plenum 54 is in flow communication with a second discharge channel 70, and wherein the second discharge channel 70 defines a second discharge path; wherein the first discharge path intersects the second discharge path at a position selected from (a) above a surface of a glass ribbon 96 or (b) at a surface of a glass ribbon 96 or (c) below a surface of a glass ribbon 96.

Clause 33: A drawdown assembly 81, comprising: a receiver 83; and at least one vapor coater 100, 102 located adjacent a first side 106 and/or a second side 108 of a glass ribbon path 98. For example, the receiver can comprise a forming trough 86 or an elongated trough having a discharge slot.

Clause 34: The drawdown assembly 81 of clause 33, including at least one flame spray device 104 located adjacent the first side 106 and/or second side 108 of the glass ribbon path 98.

Clause 35: The drawdown assembly 81 of clauses 33 or 34, including a vapor coater 100 located on the second side 108, another vapor coater 102 located on the first side 106, and a flame spray device 104 located upstream of the vapor coater 100 on the first side 106.

Clause 36: A method of forming a coated glass article in a drawdown process, comprising: locating at least one coater 100, 104 adjacent a second side 108 of a glass ribbon path 98; locating at least one other coater 102 adjacent a first side 106 of the glass ribbon path 98; and using the coaters 100, 102, 104 to apply at least one coating on at least one of the opposed sides of a glass ribbon 96.

Clause 37: The method of clause 36, wherein the at least one coater 100, 104 comprises a chemical vapor deposition coater 100.

Clause 38: The method of clauses 36 or 37, wherein the at least one other coater 102 comprises a chemical vapor deposition coater.

Clause 39: The method of any of clauses 36 to 38, further including at least one flame spray coater 104 located on the second side 108, and, optionally, at least one flame spray coater 104 located on the first side 106.

Clause 40: The method of any of clauses 36 to 39, wherein the at least one coater 100, 102, 104 comprises a flame spray device 104 located upstream of a chemical vapor deposition coater 100.

Clause 41: A double sided coated article 110 formed by a drawdown process, comprising: a glass substrate 12 having a first surface 14 and an opposed second surface 16; a second coating 120 formed over the second surface 16 by a first chemical vapor deposition coater 100 adjacent the first surface 114; and a first coating 118 formed over the first surface 114 by another chemical vapor deposition coater 102 adjacent the first surface 114.

Clause 42: A buffer layer 42 for a solar cell 10, comprising: tin oxide and at least one of zinc, indium, gallium, and magnesium.

Clause 43: The buffer layer 42 of clause 42, wherein the buffer layer 42 comprises tin oxide and zinc.

Clause 44: The buffer layer 42 of clause 42, wherein the buffer layer 42 comprises tin oxide and magnesium.

Clause 45: An article, for example a solar cell 10, comprising: a first substrate 12 having a first surface 14 and a second surface 16: an underlayer 18 located over the second surface 16; a first conductive layer 20 over the underlayer 18; an overlayer 22 over the first conductive layer 20; a semiconductor layer 24 over the first conductive layer 20; and a second conductive layer 26 over the semiconductor layer 24. The overlayer 18 comprises a buffer layer 42 comprising tin oxide and at least one of zinc, indium, gallium, and magnesium.

Clause 46: The solar cell 10 of clause 45, wherein the buffer layer comprises tin oxide and zinc.

Clause 47: The article of clause 45, wherein the buffer layer 42 comprises tin oxide and magnesium.

Clause 48: The article of any of clauses 45 to 47, including a functional layer 32 over the first surface 14 of the substrate 12, wherein the functional layer 32 is selected from the group consisting of an antireflective layer 33 and an external light extraction layer 35.

Clause 49: The article of any of clauses 45 to 48, wherein at least one layer over the first surface 14 and at least one layer over the second surface 16 are formed in a glass drawdown process having at least one coater 100, 102, 104 located on opposed sides of a glass ribbon path 98.

Clause 50: The article of any of clauses 45 to 49, wherein the first conductive layer 20 comprises a conductive oxide and at least one dopant selected from the group consisting of tungsten, molybdenum, niobium, and/or fluorine.

Clause 51: The article of any of clauses 45 to 50, wherein the first substrate 12 comprises low iron glass.

Clause 52: The article of any of clauses 45 to 51, wherein the underlayer 18 comprises a sodium ion barrier layer 38 comprising silicon oxide.

Clause 53: The article of any of clauses 45 to 52, wherein the underlayer 18 comprises a bottom optical layer 36 comprising an oxide of tin, zinc, silicon, aluminum, titanium, and/or mixtures thereof.

Clause 54: The article of any of clauses 45 to 53, wherein the underlayer 18 comprises a sodium barrier layer 38 comprising silicon oxide and a bottom optical layer 36 comprising oxides of tin and zinc.

Clause 55: The article of any of clauses 45 to 54, wherein the first conductive layer 20 comprises tin oxide and tungsten.

Clause 56: The article of any of clauses 45 to 55, wherein the first conductive layer 20 comprises a first layer comprising tin oxide and tungsten, and a second layer comprising tin oxide and fluorine.

Clause 57: The article of any of clauses 45 to 56, wherein the overlayer 22 comprises an insulating layer 44 comprising cadmium sulfide and/or cadmium sulfate.

Clause 58: The article of any of clauses 45 to 57, wherein the overlayer 22 comprises a buffer layer 42 comprising tin oxide and zinc and/or magnesium, and an insulating layer 44 comprising cadmium sulfide and/or cadmium sulfate.

Clause 59: The article of any of clauses 45 to 58, wherein the semiconductor layer 24 comprises cadmium telluride.

Clause 60: The article of any of clauses 45 to 59, wherein the second conductive layer 26 comprises a metallic layer.

Clause 61: The article of any of clauses 45 to 60, wherein the second conductive layer 26 comprises silver.

Clause 62: The article of any of clauses 45 to 61, including a second substrate 28 over the second conductive layer 26, wherein the second substrate 28 comprises glass.

Clause 63: The article of any of clauses 45 to 62, including an internal light extraction region 34 in and/or on the second surface 16 of the substrate 12, wherein the internal light extraction region 34 comprises nanoparticles 40.

Clause 64: The article of any of clauses 45 to 63, including a functional layer 32 over the first surface 14 of the substrate 12, wherein the functional layer 32 is selected from the group consisting of an antireflective layer 33 and an external light extraction layer 35.

Clause 65: The article of clause 64, wherein the antireflective layer 33 comprises an oxide of a material selected from the group consisting of titanium, zirconium, zinc, tin, and mixtures thereof.

Clause 66: The article of clauses 64 or 65, wherein the external light extraction layer 35 is selected from the group consisting of silica, alumina, zinc oxide, titania, zirconia, tin oxide, and mixtures thereof.

Clause 67: The article of any of clauses 45 to 66, wherein the first conductive layer 20 comprises a first region deposited from a first precursor material and a second region deposited from a second precursor material.

Clause 68: The article of clause 67, wherein the first precursor material comprises MBTC and the second precursor material is selected from the group consisting of TTC and DBTA.

Clause 69: A transparent conductive oxide layer 20 for an electronic device, comprising: a tin oxide layer doped with a material selected from the group consisting of tungsten, molybdenum, and niobium.

Clause 70: The transparent conductive oxide layer 20 of clause 69, wherein the transparent conductive oxide layer 20 comprises tin oxide and tungsten.

Clause 71: The transparent conductive oxide layer 20 of clauses 69 or 70, wherein the electronic device is selected from the group consisting of a solar cell, a photovoltaic cell, an organic light emitting diode, and a light emitting diode.

Clause 72: A coated article 110, comprising: a first substrate 12 having a first surface 14 and a second surface 16; a first coating 118 over the first surface 14; and a second coating 120 over the second surface 16. The second coating 120 comprises a first conductive layer 20 comprising tin oxide doped with a material selected from the group consisting of tungsten, molybdenum, and niobium.

Clause 73: The coated article 110 of clause 72, wherein the first conductive layer 20 comprises tin oxide doped with tungsten.

Clause 74: The coated article 110 of clauses 72 or 73, wherein at least one layer over the first surface 14 and at least one layer over the second surface 16 are formed in a glass drawdown process having at least one coater 100, 102, 104 on opposed sides of a glass ribbon path 98.

Clause 75: The coated article 110 of any of clauses 72 to 74, wherein the coated article 110 is selected from the group consisting of a solar cell, a photovoltaic cell, an organic light emitting diode, and a light emitting diode.

Clause 76: The coated article 110 of any of clauses 72 to 75, wherein the second coating 120 comprises: an underlayer 18 located over the second surface 116; the first conductive layer 20 over the underlayer 18; an overlayer 22 over the first conductive layer 20; a semiconductor layer 24 over the first conductive layer 20; and a second conductive layer 26 over the semiconductor layer 24.

Clause 77: The coated article 110 of clause 76, wherein the first substrate 12 comprises low iron glass.

Clause 78: The coated article 110 of clauses 76 or 77, wherein the underlayer 18 comprises a sodium ion barrier layer 38 comprising silicon oxide.

Clause 79: The coated article 110 of any of clauses 76 to 78, wherein the underlayer 18 comprises a bottom optical layer 36 comprising an oxide of tin, zinc, silicon, aluminum, titanium, and/or mixtures thereof.

Clause 80: The coated article 110 of any of clauses 76 to 79, wherein the underlayer 18 comprises a sodium barrier layer 38 comprising silicon oxide and a bottom optical layer 36 comprising oxides of tin and zinc.

Clause 81: The coated article 110 of any of clauses 76 to 80, wherein the first conductive layer 20 comprises tin oxide and tungsten.

Clause 82: The coated article 110 of any of clauses 76 to 81, wherein the first conductive layer 20 comprises a first layer comprising tin oxide and tungsten, and a second layer comprising tin oxide and fluorine.

Clause 83: The coated article 110 of any of clauses 76 to 82, wherein the overlayer 22 comprises a buffer layer 42 comprising tin oxide and at least one of zinc, indium, gallium, magnesium, and nitrogen.

Clause 84: The coated article 110 of any of clauses 76 to 83, wherein the overlayer 22 comprises a buffer layer 42 comprising tin oxide and zinc.

Clause 85: The coated article 110 of any of clauses 76 to 84, wherein the overlayer 22 comprises an insulating layer 44 comprising cadmium sulfide and/or cadmium sulfate.

Clause 86: The coated article 110 of any of clauses 76 to 85, wherein the overlayer 22 comprises a buffer layer 42 comprising tin oxide and zinc and/or magnesium, and an insulating layer 44 comprising cadmium sulfide and/or cadmium sulfate.

Clause 87: The coated article 110 of any of clauses 76 to 86, wherein the semiconductor layer 24 comprises cadmium telluride.

Clause 88: The coated article 110 of any of clauses 76 to 87, wherein the second conductive layer 26 comprises a metallic layer.

Clause 89: The coated article 110 of any of clauses 76 to 88, wherein the second conductive layer 26 comprises silver.

Clause 90: The coated article 110 of any of clauses 78 to 89, including a second substrate 28 over the second conductive layer 26, wherein the second substrate 28 comprises glass.

Clause 91: The coated article 110 of any of clauses 76 to 90, including an internal light extraction region 34 in and/or on the second surface 16 of the substrate 12, wherein the internal light extraction region 34 comprises nanoparticles 40.

Clause 92: The coated article 110 of any of clauses 76 to 91, including a functional layer 32 over the first surface 14 of the substrate 12, wherein the functional layer 32 is selected from the group consisting of an antireflective layer 33 and an external light extraction layer 35.

Clause 93: The coated article 110 of clause 92, wherein the antireflective layer 33 comprises an oxide of a material selected from the group consisting of titanium, zirconium, zinc, tin, and mixtures thereof.

Clause 94: The coated article 110 of clauses 92 or 93, wherein the external light extraction layer 35 is selected from the group consisting of silica, alumina, zinc oxide, titania, zirconia, tin oxide, and mixtures thereof.

Clause 95: The coated article 110 of any of clauses 76 to 94, wherein the first conductive layer 20 comprises a first region deposited from a first precursor material and a second region deposited from a second precursor material.

Clause 96: The coated article 110 of clause 95, wherein the first precursor material comprises MBTC and the second precursor material is selected from the group consisting of TTC and DBTA.

Clause 97: A method of making a making an article 110, such as a solar cell 10, in a glass drawdown process, comprising: locating at least one coater 100, 104 adjacent a second side 108 of a glass ribbon path 98; optionally, locating at least one other coater 102, 104 adjacent a first side 106 of the glass ribbon path 98; and applying a second coating over a second surface 116 of a glass ribbon 96, wherein the second coating comprises at least one of (i) a buffer layer 42 comprising tin oxide and at least one material selected from the group consisting of zinc, indium, gallium, and magnesium, and (ii) a transparent conductive oxide layer 20 comprising tin oxide doped with a material selected from the group consisting of tungsten, molybdenum, and niobium.

Clause 98: The method of clause 97, wherein the buffer layer 42 comprises tin oxide and zinc.

Clause 99: The method of clause 97, wherein the buffer layer 42 comprises tin oxide and magnesium.

Clause 100: The method of any of clauses 97 to 99, wherein the transparent conductive oxide layer 20 comprises tin oxide doped with tungsten.

Clause 101: A vapor deposition coater 46, 47, comprising: a nozzle block 50 comprising a discharge face 51, at least one discharge channel 62, 66, 70 in flow communication with at least one inlet plenum 52, 54, 56. An angle of the at least one discharge channel 62, 66, 70 is adjustable with respect to the discharge face 51.

Clause 102: The vapor deposition coater 46, 47 of clause 101, including a first discharge channel 62, a second discharge channel 66, and a third discharge channel 70, wherein at least one of the discharge channels 62, 66, 70 is angled with respect to the discharge face 51 and at least one of the discharge channels 62, 66, 70 is perpendicular to the discharge face 51.

Clause 103: The vapor deposition coater 46, 47 of clauses 101 or 102, wherein the first discharge channel 62 has a first discharge outlet 64, the second discharge channel 66 has a second discharge outlet 68, and the third discharge channel 70 has a third discharge outlet 72, wherein the first discharge outlet 64, the second discharge outlet 66, and the third discharge outlet 72 are located on the discharge face 51.

Clause 104: The vapor deposition coater 48, 47 of clauses 101 or 102, wherein the first discharge channel 62 has a first discharge outlet 64, the second discharge channel 66 has a second discharge outlet 68, and the third discharge channel 70 has a third discharge outlet 72, wherein the second discharge outlet 68 is located on the discharge face 51, and wherein the first discharge outlet 64 and the third discharge outlet 72 are in flow communication with the second discharge channel 66 above the discharge face 51.

Clause 105: A method of forming a coating layer on a glass substrate in a glass manufacturing process, comprising: providing a first coating precursor material for a selected coating layer composition to at least one multislot coater 46, 47 to form a first coating region of the selected coating layer; and providing a second coating precursor material for the selected coating layer composition to at least one multislot coater 46, 47 to form a second coating region of the selected coating layer over the first region. The first coating precursor material is different than the second precursor coating material.

Clause 106: The method of clause 105, wherein the glass manufacturing process is a float glass process and the at least one multislot coater 46, 47 is located in a float bath.

Clause 107: The method of clause 105, wherein the glass manufacturing process is a glass drawdown process and the at least one multislot coater 46, 47 is located adjacent a glass ribbon path 98.

Clause 108: The method of clause 107, wherein the glass manufacturing process is a glass drawdown process having a glass ribbon path 98 comprising a first side 106 and a second side 108, wherein at least one multislot coater 100 is located adjacent the first side 106 of the glass ribbon path 98, and wherein at least one other multislot coater 102 is located adjacent the second side 108 of the glass ribbon path 98.

Clause 109: The method of clause 107, wherein the glass manufacturing process is a glass drawdown process having a glass ribbon path 98 comprising a first side 106 and a second side 108, wherein at least one multislot coater 100 is located adjacent the second side 108 of the glass ribbon path 98, and wherein at least one other multislot coater 102 is located adjacent the first side 106 of the glass ribbon path 98.

Clause 110: A method of forming a coating on a glass substrate in a glass manufacturing process, comprising: providing a first coating precursor material to a first discharge channel 62, 66, 70 having a first discharge path; and providing a second coating precursor material to a second discharge channel 62, 66, 70 having a second discharge path. The first discharge path intersects the second discharge path at a position selected from (a) above a surface of a glass ribbon 96 or (b) at a surface of a glass ribbon 96 or (c) below a surface of a glass ribbon 96.

It will be readily appreciated by those skilled in the art that modifications may be made to the invention without departing from the concepts disclosed in the foregoing description. Accordingly, the particular embodiments described in detail herein are illustrative only and are not limiting to the scope of the invention, which is to be given the full breadth of the appended claims and any and all equivalents thereof.

What is claimed is:

1. A method of forming a coating layer on a glass substrate in a glass manufacturing process, comprising:
   providing a first coating precursor material to a first discharge channel having a first discharge path, wherein the first coating precursor material comprises monobutyltin trichloride or tin tetrachloride; and
   providing a second coating precursor material to a second discharge channel having a second discharge path,
   wherein the first coating precursor material is different than the second precursor coating material, and
   wherein the first discharge path intersects the second discharge path at a position above a surface of the glass substrate or at the surface of the glass substrate or below the surface of the glass substrate.

2. The method of claim 1, wherein the glass manufacturing process is a float glass process and the first discharge channel is located in a float bath.

3. The method of claim 1, wherein the glass manufacturing process is a glass drawdown process.

4. The method of claim 1, wherein the glass manufacturing process is a glass drawdown process having a glass ribbon flow path comprising a first side and a second side, wherein at least the first coating precursor and the second precursor coating material are provided on the second side of the glass ribbon flow path, and wherein the method further comprises providing a second coating to the first side of the glass ribbon flow path.

5. The method of claim 1, wherein the coating layer is formed on the glass substrate by vapor deposition.

6. The method of claim 1, wherein the second coating precursor material comprises tin tetrachloride or dibutyltin diacetate or tungsten tetrachloride.

7. A method of making a coated glass article in a glass drawdown process, comprising:
   positioning at least one first coater adjacent a first side of a glass ribbon flow path;
   positioning at least one second coater adjacent a second side of the glass ribbon flow path;
   depositing a first coating on a first side of a glass ribbon with the at least one first coater; and
   depositing a second coating on a second side of a glass ribbon with the second coater,
   wherein the at least one first coating and the second coating are different, and wherein the at least one first coater comprises a chemical vapor deposition coater, wherein the at least one first coater comprises a first discharge channel having a first discharge path and a second discharge channel having a second discharge path that intersects the first discharge path.

8. The method of claim 7, wherein the at least one second coater comprises a chemical vapor deposition coater.

9. The method of claim 7, wherein the at least one second coater comprises a flame spray coater.

10. The method of claim 7, wherein the at least one second coater comprises a flame spray device located above a chemical vapor deposition coater.

11. The method of claim 7, wherein at least one of the at least one first coater and the at least one second coater comprises a multislot coater.

12. The method of claim 7, wherein the second coating comprises at least one of (1) a buffer layer comprising tin oxide and at least one material selected from the group consisting of zinc, indium, gallium, and magnesium, and (2) a transparent conductive oxide layer comprising tin oxide doped with a material selected from the group consisting of tungsten, molybdenum, and niobium.

13. The method of claim 12, wherein the buffer layer comprises tin oxide and zinc.

14. The method of claim 12, wherein the buffer layer comprises tin oxide and magnesium.

15. The method of claim 12, wherein the transparent conductive oxide layer comprises tin oxide doped with tungsten.

16. The method of claim 7 wherein the at least one second coater comprises a first discharge channel having a first discharge path and a second discharge channel having a second discharge path that intersects the first discharge path.

17. The method of claim 16 wherein the at least one second coater further comprises a third discharge channel at an angle to a discharge face.

18. The method of claim 7 wherein the first coating or the second coating comprises tin oxide doped with tungsten.

* * * * *